(12) United States Patent
Neal et al.

(10) Patent No.: US 11,901,262 B2
(45) Date of Patent: Feb. 13, 2024

(54) COOLING SOLUTION INCLUDING MICROCHANNEL ARRAYS AND METHODS OF FORMING THE SAME

(71) Applicant: Intel Corporation, Santa Clara, CA (US)

(72) Inventors: Nicholas Neal, Gilbert, AZ (US); Zhimin Wan, Chandler, AZ (US); Shankar Devasenathipathy, Tempe, AZ (US); Je-Young Chang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1135 days.

(21) Appl. No.: 16/256,831

(22) Filed: Jan. 24, 2019

(65) Prior Publication Data

US 2020/0243418 A1 Jul. 30, 2020

(51) Int. Cl.
*H01L 23/433* (2006.01)
*F28F 19/01* (2006.01)
*H01L 21/48* (2006.01)

(52) U.S. Cl.
CPC .......... *H01L 23/4336* (2013.01); *F28F 19/01* (2013.01); *H01L 21/4882* (2013.01)

(58) Field of Classification Search
None
See application file for complete search history.

(56) References Cited

U.S. PATENT DOCUMENTS

2019/0004573 A1* 1/2019 Kulkarni ............... H01L 23/473

* cited by examiner

*Primary Examiner* — Jack S Chen
(74) *Attorney, Agent, or Firm* — Essential Patents Group, LLP

(57) ABSTRACT

Embodiments include a cooling solution having a first array of fins, where the first array of fins extend vertically from the substrate, and where adjacent individual fins of the first array are separated from each other by a microchannel. A second array of fins extend vertically from the substrate, where a channel region is between the first array of fins and the second array of fins.

16 Claims, 18 Drawing Sheets

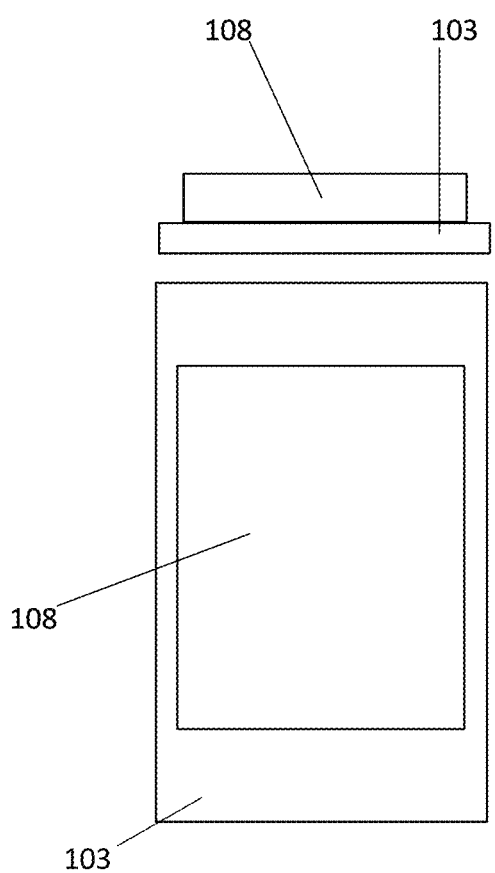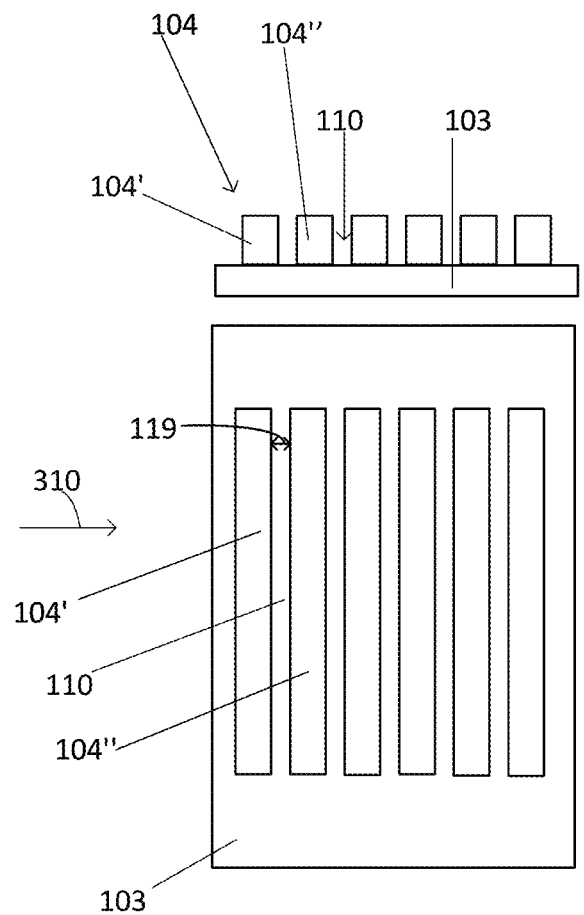
FIG. 3A
FIG. 3B

COOLING SOLUTION INCLUDING MICROCHANNEL ARRAYS AND METHODS OF FORMING THE SAME

TECHNICAL FIELD

Embodiments of the present description generally relate to the field of microelectronic packaging, and, more particularly, to microelectronic packages including cooling solutions.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. Mobile products, such as cell phones, for example, often have microelectronic packages with small form factors which can pose many thermal challenges. Due to increasingly shrinking conductive traces, and the continually increasing complexity and power density of logic within devices, advanced cooling solutions become increasingly necessary.

Various cooling solutions have been employed, such as integrated heat spreaders, for example, which may be thermally coupled to devices residing within a package structure, in order to dissipate heat generated from the devices. The cooling performance of a particular cooling solution may be affected by a contact resistance between a cooling solution and the package structure, as well as by the effectiveness of heat transfer of the cooling solution. Adequate cooling of package devices is necessary to prevent device failure at extended elevated temperatures, and to ensure reliable operation of the device.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 3A-3D illustrate top views of package structures formed according to methods of fabricating blockage resistant microchannel fin array structures, according to embodiments;

DETAILED DESCRIPTION

Figure 1A:
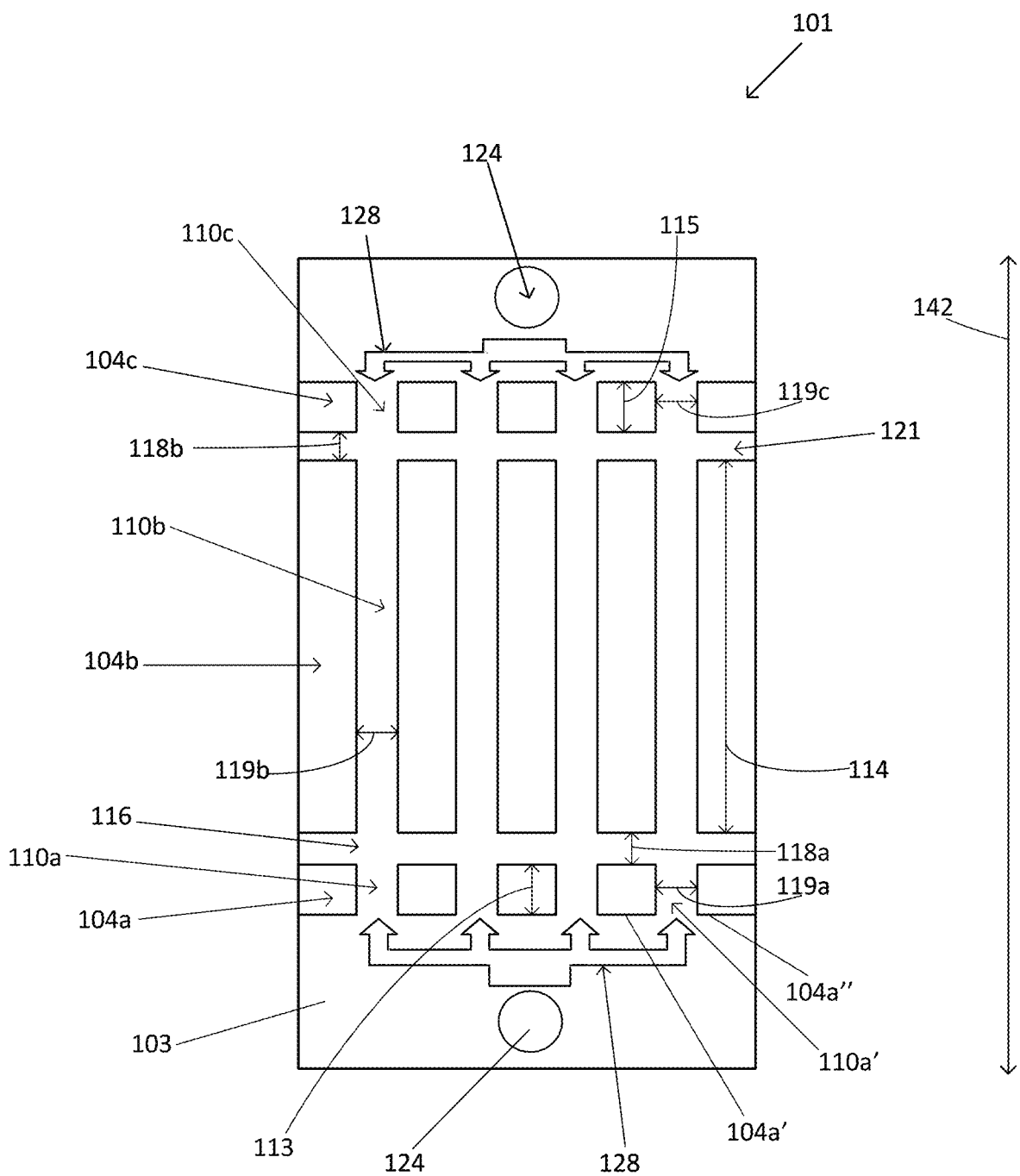
FIGS. 1A-1C illustrate top views of cooling solution structures having blockage resistant microchannel fin array structures, according to embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/− 10 percent of a target value.

Various implementations of the embodiments herein may be formed or carried out on a substrate, such as a package substrate. In some embodiments, a package substrate may comprise any suitable type of substrate capable of providing electrical communications between an electrical component, such as an integrated circuit (IC) die, and a next-level component to which an IC package may be coupled (such as a circuit board, for example). In other embodiments, the substrate may comprise any suitable type of substrate capable of providing electrical communication between an IC die and an upper IC package coupled with a lower IC/die package, and in some embodiments, a substrate may comprise any suitable type of substrate capable of providing electrical communication between an upper IC package and a next-level component to which an IC package is coupled.

A substrate may also provide structural support for a device, such as a die. By way of example, in some embodiments, a substrate may comprise a multi-layer substrate—including alternating layers of a dielectric material and metal—built-up around a core layer (either a dielectric or a metal core), and may include through via structures that extend through the core. In other embodiments, a substrate may comprise a coreless multi-layer substrate, in which case through via structures may be absent. Other types of substrates and substrate materials may also find use with the disclosed embodiments (e.g., ceramics, sapphire, glass, etc.). Further, according to some embodiments, a substrate may comprise alternating layers of dielectric material and metal that are built-up over a die itself—this process is sometimes referred to as a "bump-less build-up process." Where such an approach is utilized, conductive interconnects may or may not be needed (as the build-up layers may be disposed directly over a die/device, in some cases).

A die may include a front-side and an opposing back-side, and may be an integrated circuit die and/or an integrated circuit device, in some embodiments. In some embodiments, the front-side may be referred to as the "active surface" of the die. A number of interconnects may extend from the die's front-side to an underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some embodiments, a die may be disposed on a substrate in a flip-chip arrangement. In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be on the terminals of a substrate and/or die, and these terminals may then be joined using a solder reflow process, for example. Of course, it should be understood that many other types of interconnects and materials are possible (e.g., wirebonds extending between a die and a substrate). In some embodiments herein, a die may be coupled with a substrate by a number of interconnects in a flip-chip arrangement. However, in other embodiments, alternative structures and/or methods may be utilized to couple a die with a substrate.

Described herein are embodiments of microelectronic cooling solution structures, such as cooling solution structures comprising blockage resistant microchannel fin array structures. The blockage resistant microchannel fin array structures of the cooling structures described herein improve the ability of the cooling structures to provide cooling for microelectronic devices residing within microelectronic package structures, for example. In an embodiment, a first row of microchannel fins may be adjacent a second row of microchannel fins, where a distance between the first row of microchannel fins and the second row of microchannel fins enable particle filtering within the cooling solution, as well as providing alternate routes of fluid flow within the cooling solution. In the event of a blockage (such as by a particle, for example) within a microchannel of a microchannel fin array structure, a distance/channel region between the first and second rows of the microchannel fin arrays provides for alternate routes of fluid flow within the cooling solution, and thus enhances heat transfer capabilities.

The cooling solutions of the embodiments herein may be thermally coupled with one or more devices within a microelectronic package that may reside within any suitable type of microelectronic package structure, such as a microelectronic device comprising silicon, for example. In an embodiment, the cooling solution may comprise a thermally conductive material, such as copper, aluminum, silicon, or ceramic materials such as aluminum nitride, or silicon carbide for example.

In an embodiment, one or more die may be on a substrate. In an embodiment, a thermal interface material (TIM) may be on a surface of the die. A cooling solution comprising blockage resistant microchannel fin array structures, may be on the TIM, and may be thermally coupled with the die disposed on the substrate. The cooling solutions of the embodiments herein provide enhanced cooling of devices within a package, such as in locations where hot spots may increase local temperatures within the microelectronic package. By thermally coupling the cooling solution with the die, improved thermal efficiency is achieved due to the blockage resistant design of the cooling solution of the embodiments disclosed herein, and thermal failure of devices within a package structure is reduced.

FIG. 1A is a top view of a portion of a cooling solution structure 101, arranged in accordance with some embodiments of the present disclosure. The cooling solution 101 comprises a particle filtering mechanism and flow redirection design that is realized through the utilization of two or more microchannel fin array structures within the cooling solution 101. At least two microchannel fin array structures may be vertically disposed on a base substrate 103. In an embodiment, the cooling solution 101 may comprise three microchannel fin array structures: a first microchannel fin array 104a, a second microchannel fin array 104b and a third microchannel fin array 104c. In other embodiments, the cooling solution 101 may comprise any number of separate microchannel fin array structures/segments, as may be required for a particular application, where each microchannel fin array segment may be separated by a channel region, such as channel regions 116, 121 for example. In an embodiment, the first microchannel fin array 104a may comprise a plurality of vertical fins 104a, wherein adjacent individual vertical fins are separated by a microchannel 110a, such as the microchannel 110a' that is a between a first fin 104a' and a second fin 104a", for example. A microchannel width 119a may represent a width of an individual microchannel 110a, wherein the microchannel width 119a may comprise a magnitude of below about 1000 microns, in some cases, and below about 100 microns, in other embodiments.

The microchannels 110a, 110b, 110c between individual fins of the microchannel arrays 104a, 104b, 104c may accommodate a fluid 128, such as a gas or liquid, for example, which may flow within each microchannel between individual fins of the microchannel arrays 104a, 104b, 104c. Five fins are shown for each of the microchannel fin arrays 104a, 104b, 104c, however in other embodiments, any number of fins may be included within any number of microchannel fin array segments. In an embodiment, individual fins of the first fin array 104a may comprise a length 113. The length 113 may comprise between about 50 microns and 1000 microns, in an embodiment, but may comprise any suitable length as required by a particular application.

The second fin array 104b may comprise a plurality of individual fins, wherein microchannels 110b are between the individual fins of the second array 104b. Each microchannel 110b may comprise a second microchannel width 119b, and in some embodiments, the second microchannel width 119b may be about the same magnitude as the first microchannel width 119a. In other embodiments, the first microchannel channel width 119a and the second microchannel width 119b may be different from each other. In an embodiment, individual fins of the second fin array 104b may comprise a length 114. The length 114 may comprise between about 1 centimeter and 10 centimeters, in an embodiment, but may comprise any suitable length as required by a particular application. In an embodiment, the fin length 114 may comprise a greater magnitude than the fin length 113 of the microchannel fin array 104a. In an embodiment, individual fins of the second microchannel fin array 104b may comprise a length 114 that is greater than about twice the length 113 of individual fins of the first microchannel fin array 104a.

In an embodiment, a first channel region 116 may be located between the first microchannel fin array 104a and the second microchannel fin array 104b. The first channel region 116 may comprise a rectangular region free of fins between the first and second microchannel fin arrays 104a, 104b. The first channel region 116 may comprise a width 118a. The width 118a may comprise between about 100 to about 1000 microns, in an embodiment, but may comprise any suitable width in other embodiments. In an embodiment, the width 118a of the first channel region 116 may be about equal to the first microchannel width 119a of the microchannels 110a. In another embodiment, the width 118a of the first channel region 116 may be about equal to the second microchannel width 119b of the microchannels 110b. The first channel region 116 may provide an alternate route for fluid to flow within the microchannels 110a of the microchannel fin array 104a, in the event that any individual microchannel of the microchannel fin array 104a becomes blocked by a particle, for example, and therefore becomes unavailable for fluid flow within the blocked microchannel.

The third microchannel fin array 104c may be adjacent the second microchannel fin array 104b. The third microchannel fin array 104c may comprise a plurality of individual fins, wherein microchannels 110c are between the individual fins of the third microchannel fin array 104c. Each microchannel 110c may comprise a third microchannel channel width 119c, and in some embodiments, the third microchannel width 119c may be about the same magnitude as the first microchannel width 119a or the second microchannel width 119b. In other embodiments, the third microchannel width 119a may be different in magnitude from either the second microchannel width 119b or the first microchannel width 119a. In an embodiment, individual fins of the third microchannel fin array 104c may comprise a length 115. The length 115 may comprise between about 50 and 1000 microns, in an embodiment, but may comprise any suitable length as required by a particular application.

In an embodiment, the length 115 of the individual fins of the third microchannel fin array 104c may comprise a smaller magnitude than the length 114 of the individual fins of the second microchannel fin array 104b. In an embodiment, individual fins of the third microchannel fin array 104c may comprise a length 115 that is about the same magnitude as the length 113 of individual fins of the first microchannel fin array 104a. In an embodiment, a second channel region 121 may be located between the second microchannel fin array 104b and the third microchannel fin array 104c. The second channel region 116 may comprise a rectangular region free of fins between the second and third microchannel fin arrays 104b, 104c. The second channel region 121 may comprise a width 118b. The width 118b may comprise about 100 to about 1000 microns, in an embodiment, but may comprise any suitable width in other embodiments. In an embodiment, the width 118b of the second channel region 121 may be about equal to the first microchannel channel width 119a of the microchannels 110a. In another embodiment, the width 118b of the second channel region 121 may be about equal to the second microchannel width 119b of the microchannels 110b. In another embodiment, the magnitude of the width 118a of the first channel region 116 and the magnitude of the width 118b of the second channel region 121 may be about the same, and in other embodiments, they may differ from each other. The second channel region 121 may provide an alternate route for fluid to flow within the microchannels of the microchannel fin array 104c, in the event that a blockage/manufacturing defect is present within any of the microchannels 110c.

The substrate 103 and microchannel fin arrays 104a, 104b, 104c may comprise a thermally conductive material, such as copper, aluminum, silicon, or carbon composite materials, or may comprise a ceramic material such as aluminum nitride or silicon carbide, that may be thermally coupled to a device (not shown), such as a microelectronic semiconductor die within a package structure, for example. The microchannel fin arrays 104a, 104b, 104c may comprise the same thermally conductive material as the substrate 103, in some embodiments. However in other embodiments, the microchannel fin arrays 104a, 104b, 104c may comprise any suitable type of thermally conductive material, and may comprise a different thermally conductive material than the thermally conductive material of the substrate 103.

In an embodiment, each of the microchannels 110a, 110b, 110c within their respective microchannel fin arrays is capable of receiving a fluid 128, such as a liquid or gas, for example, which is capable of cooling a device (not shown) that may be thermally coupled to the cooling structure 101. In an embodiment, an inlet/outlet 124 holes/ports are adjacent the microchannel arrays 104a, 104c, wherein each of the inlet/outlet 124 ports/openings are capable of either receiving the fluid 128 or providing an exit route for the fluid 128. By incorporating the first and second channel regions 116, 121 adjacent to microchannel fin arrays 104a, 104c, the fluid contact area with an underlying device is increased, thus improving the heat transfer capability of the cooling solution. In addition, the cooling solution 101 allows for fluid 128 to flow 142 in either direction between an inlet/outlet port 124. In an embodiment, only one of the microchannel fin arrays 104a, 104c (whichever is chosen to be closest to the inlet) may perform a filtering function, while the other one of the microchannel fin arrays nearest the outlet does not perform the filtering function, and thus does not impede the flow of fluid towards and through the outlet port.

Figure 1B:
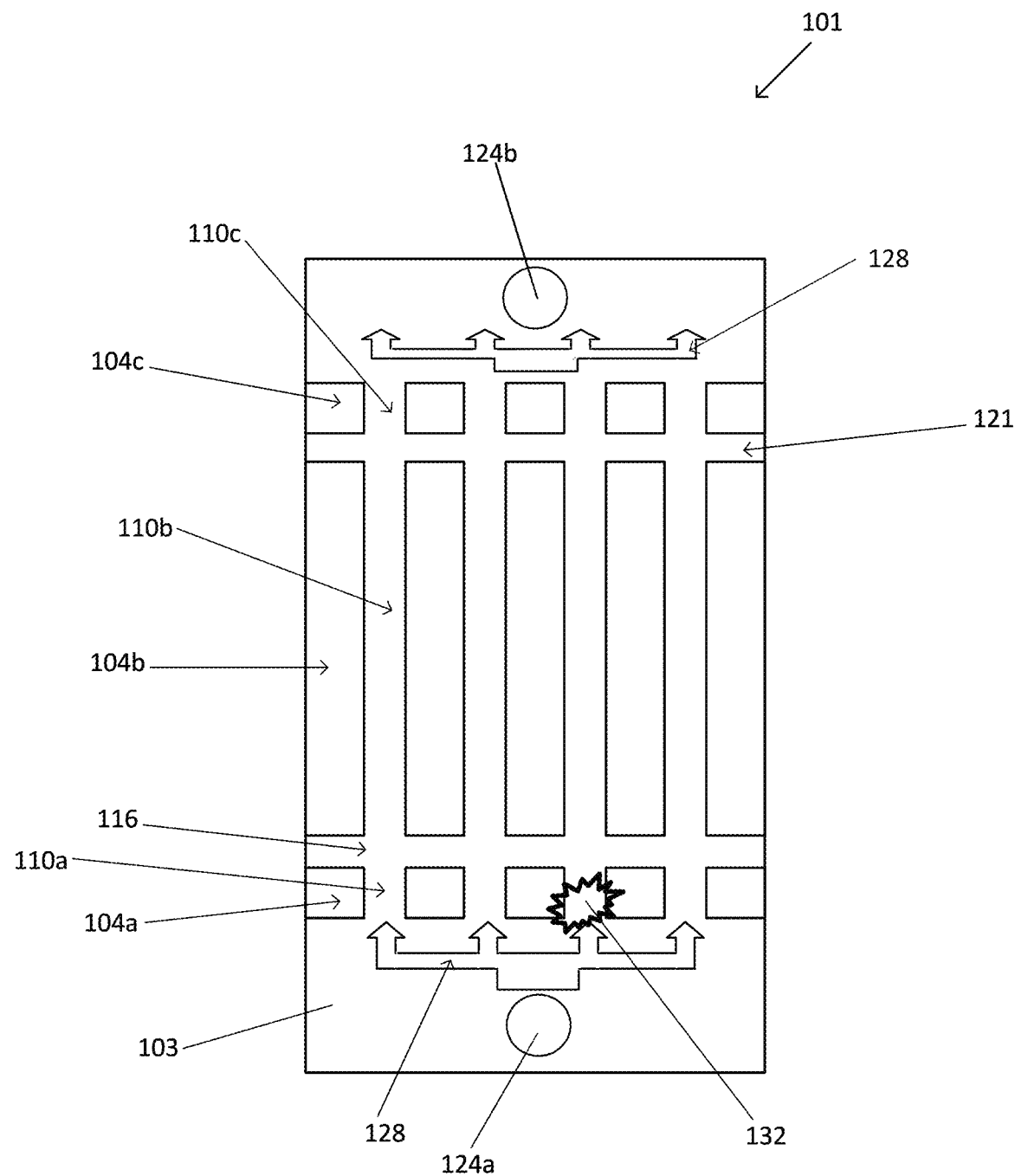

FIG. 1B depicts a top view of a portion of a cooling solution 101, where a particle 132 is lodged within a microchannel 110a of the first microchannel fin array 104a. In an embodiment, the first channel region 116 provides alternate routes by which the fluid 128a entering an inlet port 124a may move around the lodged particle 132. The fluid 128 may resume flowing through the microchannel 110b, and may then exit an exit port 124b. In this way the cooling solution 101 increases the area of fluid that is available to cool a thermally coupled device, because only a portion of the microchannels 110a, 110b is blocked, instead of an entire microchannel. When the microchannel width between individual fins of the microchannel array 104a is below about 100 microns or less, incidences of blocked channels may increase due to the microchannel width becoming smaller than particles that may be present within the fluid 128 and/or within the ambient environment. As the microchannel width decreases, the chance of a microchannel blockage due to particles which may be 50 microns in size or larger increases.

Such particles may be present within the fluid 128 in some cases, or may be generated by corrosion byproducts, microbiological growth, scale formation and/or fouling during liquid cooling system operation. Even for larger microchannel sizes, agglomerations of particles may form beyond a filtering system capabilities, and one or more microchannels can be completely blocked off. Similar problems can occur with buildup of sediments, or for example with fabrication defects of microchannels, where partial or total blockage may occur within one or more channels. Blocked microchannels may result in reduced cooling capability of the device areas covered by such blocked channels, since there is no path for the fluid 128 to be supplied to an underlying device. The embodiments herein solve the problem of blockage from varied sources of blocked microchannels, by providing alternate routes for fluid 128 to flow, thus avoiding the loss of an entire microchannel pathway, as well as redirecting flow from a blocked area of the microchannel into another, unblocked microchannel.

The cooling solution embodiments described herein can capture any particles that would otherwise block microchannels, and can redirect fluid flow to those microchannels which are free of particles. The embodiments herein enable the fabrication of cooling solutions having very dense fin arrays, where microchannel width may comprise less than about 100 microns, for example. The embodiments avoid blocking an entire microchannel and causing local hot spots within an underlying device. The embodiments herein also provide for a second layer of filtration protection that may be tailored to the dimensions of particular fins. Particulate filtering becomes more difficult as microchannel fin width becomes scaled down with increased heat transfer performance requirements.

Within a microchannel size of less than about hundred microns, even small particles can cause entire microchannels to become blocked. Additionally, small imperfections that may be present at an entrance to a microchannel can result in blockages leading to local hotspots within an underlying device. By incorporating a row of fins (that may be about the same spacing as the width of the fins themselves) in front of another microchannel fin array, a filtration system as well as a redistribution mechanism is provided. The embodiments herein eliminate most of the problems caused by particles and entrance area manufacturing imperfections. The embodiments enable various methods of manufacture, such as micro machining processes (e.g. micro skiving, micro milling, micro deforming, etc.) or additive manufacturing procedures (e.g. 3D printing, electroplating etc.). The cooling solutions herein provide an increase in heat transfer coefficient as surface area is increased.

Figure 1C:
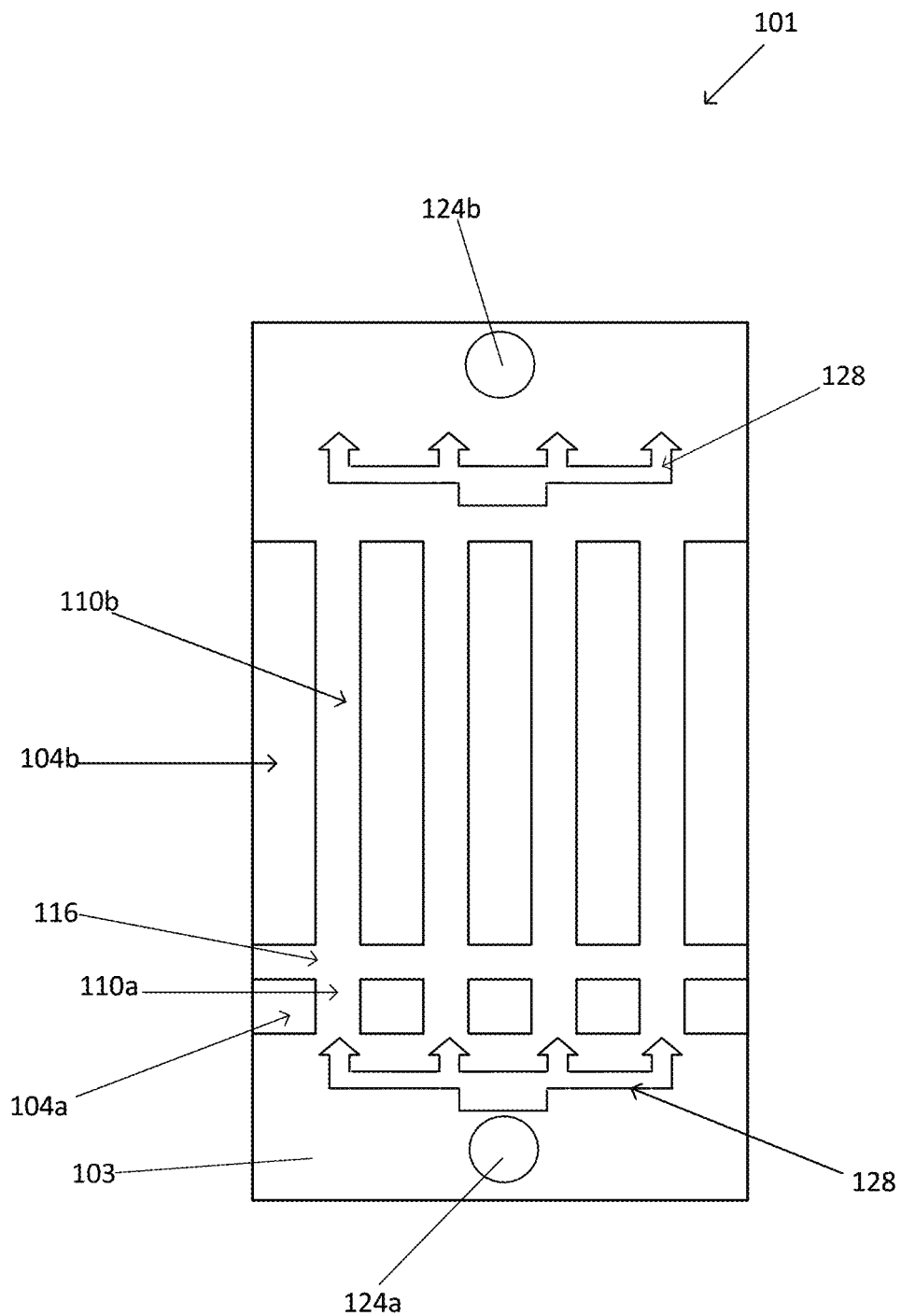

In another embodiment, FIG. 1C depicts a top view of a cooling solution 101 having two microchannel fin arrays 104a, 104b. A channel region 116 may be between the first microchannel fin array 104a and the second microchannel fin array structure 104b. The channel region 116 provides alternate routes by which the fluid 128 may move around a lodged particle and/or fabrication defects within any particular microchannel 110a, 110b, wherein the fluid 128 may resume flowing through an alternate microchannel 110a, 110b route within the first or second microchannel fin array structures 104a, 104b. The first microchannel fin array 104a is adjacent to an inlet port 124a, and the second fin array 104b is adjacent to an outlet port 124b, through which the fluid 128 may exit.

Figure 1D:
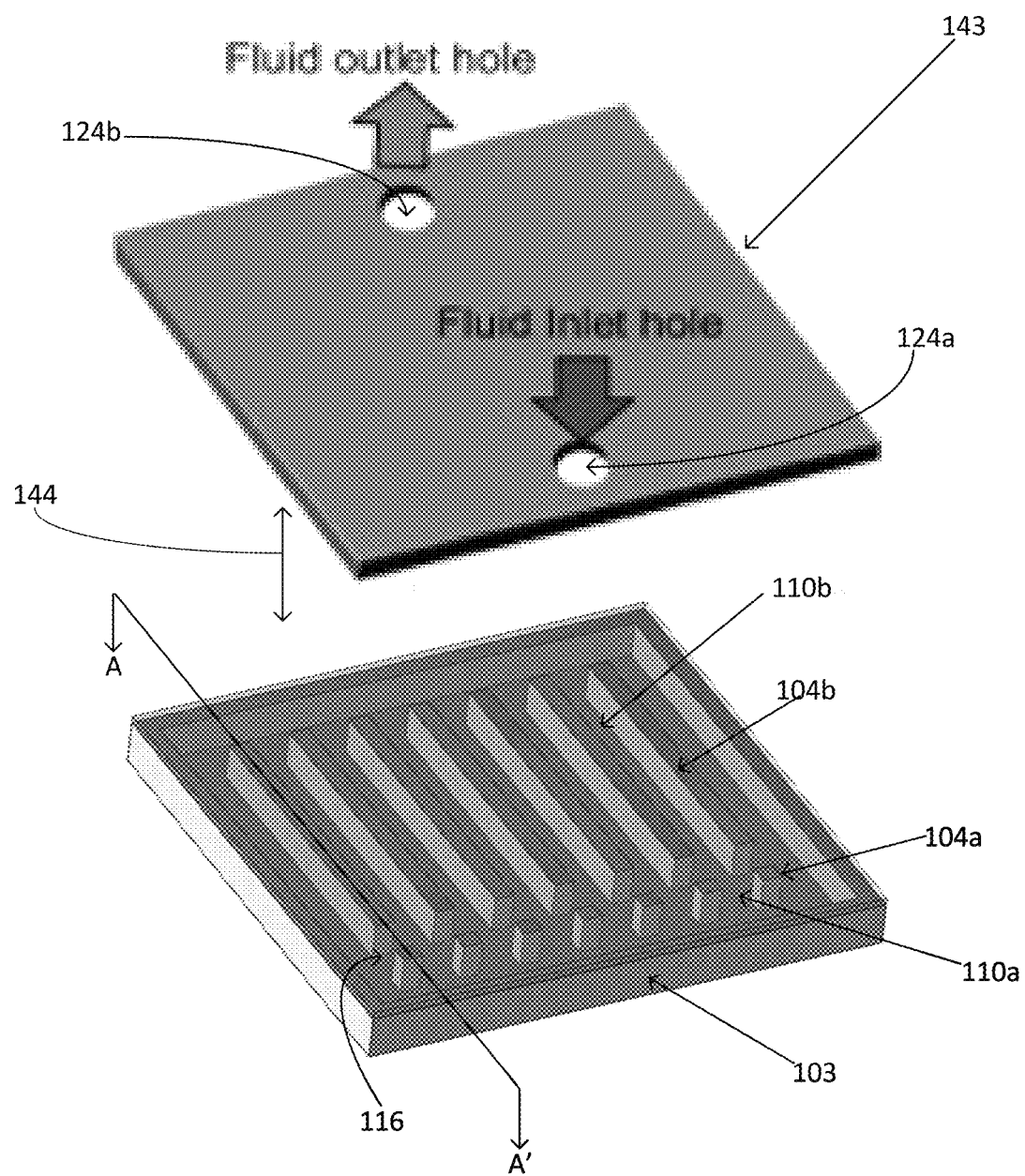
FIG. 1D illustrates a top perspective view of a portion of a cooling solution having blockage resistant microchannel fin array structures, according to embodiments.

FIG. 1D depicts a top perspective view of a cooling solution 101, depicting the first and second microchannel fin array structures 104a, 104b vertically disposed on the substrate 103, with the channel region/distance 116 disposed between the first and the second microchannel fin arrays 104a, 104b. Adjacent individual fins of the first and second microchannel fin array structures 104a, 104b are separated from each other by micro channels 110a, 110b respectively. A cover plate 143 includes an inlet port/opening 124a, and an outlet port/opening 124b. The cover plate 143 may be placed/assembled 144 onto the substrate 103. The inlet port 124a is located near the first microchannel fin array 104a, and the outlet port 124b is located near the second microchannel fin array 104b. Since the cooling solution 101 is capable of supporting fluid flow in the both directions across the microchannel fin arrays 104a, 104b, the inlet ports 124a, 124b are capable of either receiving or providing for removal of the fluid 128, depending upon a particular application. A line A-A' is depicted which extends through a length of individual fins of the first and second microchannel fin array structures 104a, 104b.

Figure 1E:
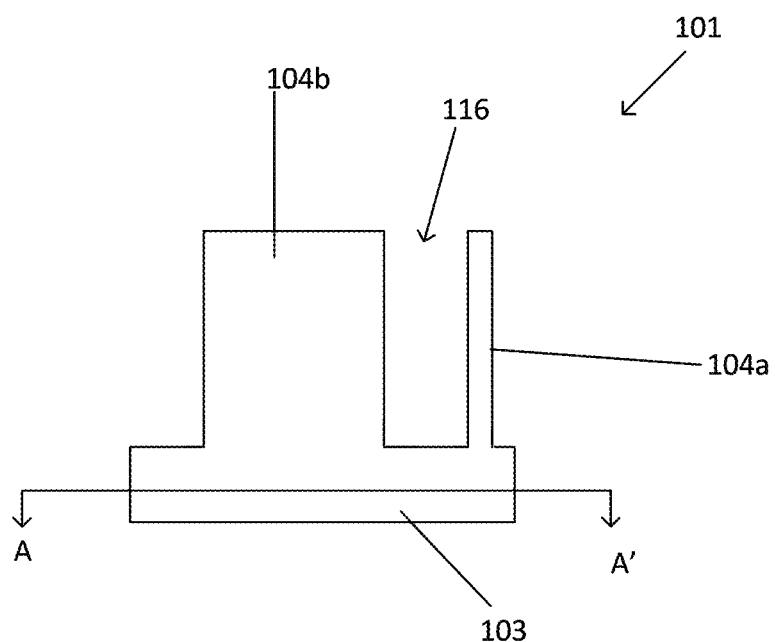
FIGS. 1E-1F illustrate cross sectional views of a portion of a blockage resistant microchannel fin array structure, according to embodiments.
Figure 1F:
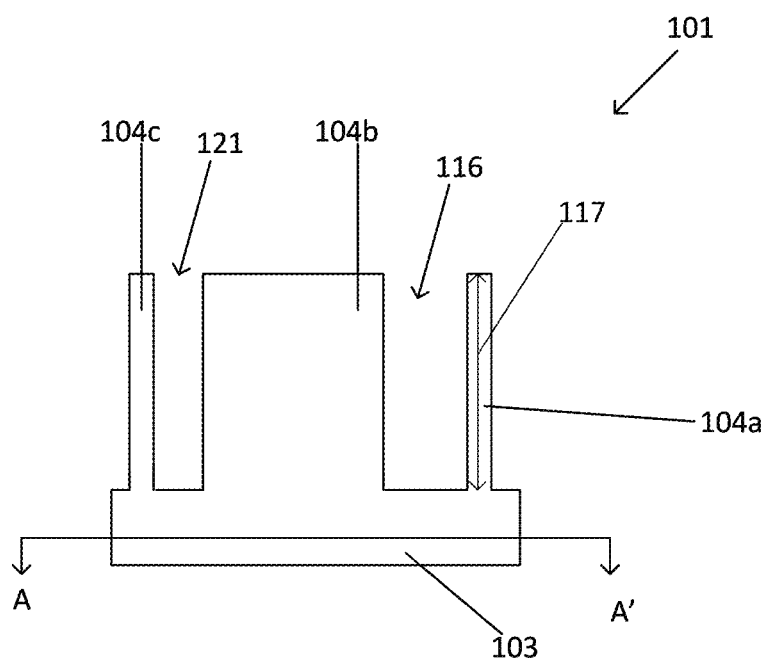

FIG. 1E depicts a cross-sectional view of the section of the cooling solution 101 through the line A-A' of FIG. 1D. The fin 104b is vertically disposed on the substrate 103, wherein the channel region 116 is between the fin 104b and the fin 104a, and is free of fins. In FIG. 1F, a cooling solution 101 comprising three microchannel fin array structures is shown (similar to the portion of the cooling solution 101 of FIG. 1A, for example). The channel region 121 is between the fin 104c and the fin 104b, and the channel region 116 is between the fin 104b and the fin 104a. An individual fin of any of the microchannel fin arrays disclosed herein, such as a fin from the first fin array 104a for example, may comprise a height 117. The height 117 may comprise between about 100 microns to about 4 millimeters, in some cases, but may comprise any suitable height 117.

Figure 1G:
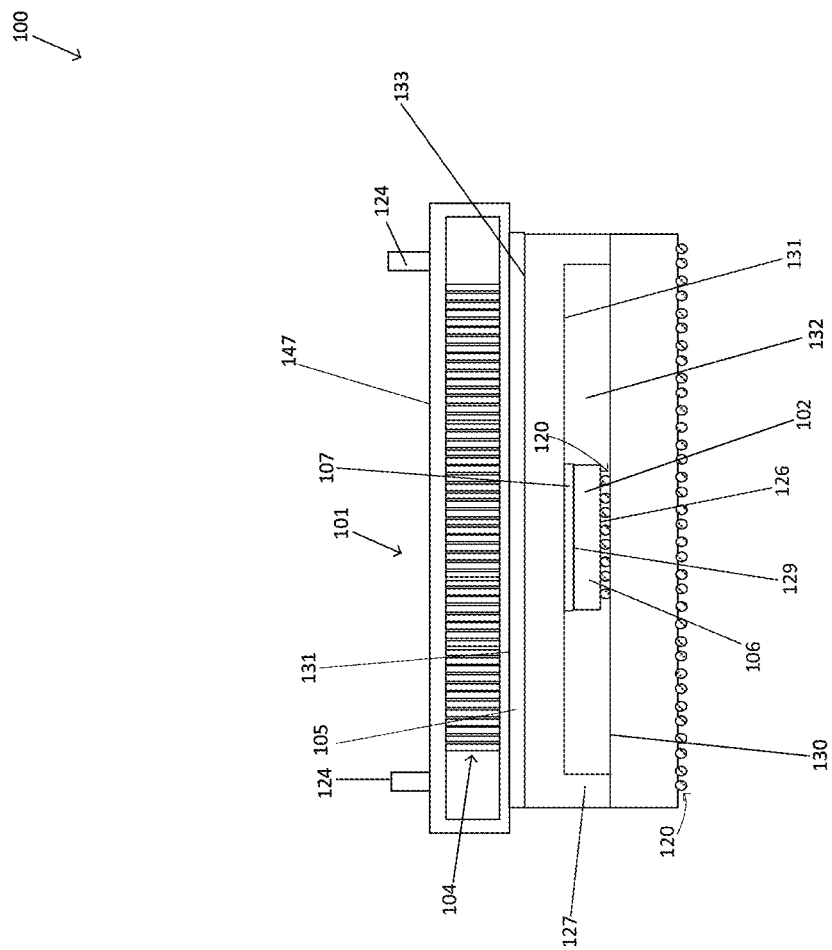
FIGS. 1G-1I illustrate cross sectional views of package structures coupled to cooling solutions having blockage resistant microchannel fin array structures, according to embodiments.

FIG. 1G depicts a cross-sectional view of a package structure 100. A first side 126 of the device 106 is on a substrate 102. The substrate 102 may comprise a portion of a system in a package substrate, a printed circuit board, an interposer, or any other suitable substrate according to the particular application. The substrate 102 may include such materials as phenolic cotton paper (e.g., FR-1), cotton paper and epoxy materials (e.g., FR-3), woven glass materials that are laminated together using an epoxy resin (e.g., FR-4), glass/paper with epoxy resin (e.g., CEM-1), glass composite with epoxy resin, woven glass cloth with polytetrafluoroethylene (e.g., PTFE CCL), or other polytetrafluoroethylene based prepreg material.

The substrate 102 may include conductive interconnect structures/routing layers (not shown) that are within dielectric layer(s), which may be configured to route electrical signals between any number of die on the substrate 102, in some embodiments. For example, interconnect structures may include routing structures such as pads or traces configured to receive electrical signals to and from devices that may be on or within the substrate 102. In some embodiments, individual ones of the conductive interconnect structures/routing layers comprise trenches, ground planes, power planes, re-distribution layers (RDLs), and/or any other appropriate electrical routing features. The dielectric layers and the conductive layers/structures within and on the dielectric layers of the substrate 102 are sometimes referred to as a "package substrate." The substrate 102 may also provide structural support for discrete components and/or any other type of device electrically coupled to the substrate 102.

Various types of substrates and substrate materials may find use with the disclosed embodiments (e.g., ceramics, sapphire, glass, etc.). The substrate 102 may be any substrate known to be suitable for one or more of flip-chip packages (FCBGA), package-on-package (PoP), system-in-package (SiP), or the like.

The device 106 may be an integrated circuit, or any other type of suitable device/die. In some embodiments, the device 104 may be any type of device which consumes a large amount of power, such as a device requiring more than 1 Watt to operate (such as a system on a chip) for example. Such a device may generate a significant amount of heat, and may require sufficient cooling to maintain an acceptable operating environment, in order to avoid adversely affecting the operations of the device 106 and possibly neighboring devices/components that may be adjacent the device 106 on the substrate 102.

In some embodiments, the device 106, may include a processing system (either single core or multi-core). In some embodiments, the device 106 may be a microprocessor, a graphics processor, a signal processor, a network processor, a chipset, a memory device etc. In some embodiments, the device may be a system-on-chip (SoC) having multiple functional units (eg. one or more processing units, one or more graphics units, one or more communications units, one or more signal processing units, one or more security units, etc.).

In some embodiments, the device 106 may be attached to a surface 130 of the substrate 102 according to a variety of suitable configurations including a flip chip configuration, or any other suitable attachment configuration. A thermal interface material (TIM) 107 may be on a second side 129 of the device 106, and may comprise any type of suitable TIM material. In an embodiment, a first side 131 of a heat spreader 127 may be on the TIM 107. Support arms/extensions of the heat spreader 127 may be on the surface 130 of the substrate 102. A second TIM 105 is on a second side 133 of the heat spreader 127, and may be electrically and thermally coupled to the device 106. The device 106 may be attached to the substrate 102 by interconnect features 120, which may comprise such conductive features as bumps or pillars, which serve to route electrical signals, such as I/O, power and/or ground signals, associated with the operation of the device 106. In some embodiments, the wire bonding or the flip chip connections may comprise conductive materials such as copper, gold and nickel.

The first side 126 of the device 106 may be an active side of the device 106, and may be attached to the surface 130 of the substrate 102, using interconnect features 120, which may comprise such conductive features as bumps or pillars, which serve to route electrical signals, associated with the operation of the device 106. In some embodiments, the wire bonding or the flip chip connections may comprise conductive materials such as copper, gold and nickel. A dielectric material 132 may be adjacent the device 106, and in some embodiments, the dielectric material 132 may comprise a mold compound. An underfill material (not shown) may be surrounding the interconnect structures 120, in some embodiments.

In an embodiment, interconnect structures 120 may comprise conductive materials such as solder materials. The interconnect structures 120 may comprise an array of ball grid array (BGA) structures, in an embodiment.

A first side 131 of the cooling solution 101 may be on the second TIM 105. The cooling solution 101 comprises at least two microchannel fin array structures 104, such as the microchannel fin array structures 104a, 104b, 104c depicted in FIG. 1A, for example. The cooling solution 101 is thermally coupled to the device 106, and is capable of providing enhanced cooling to the device 106. Inlet/outlet ports 124 are on a second side 147 of the cooling solution 101, in an embodiment, and are offset from the at least one microchannel fin array 104.

Figure 1H:
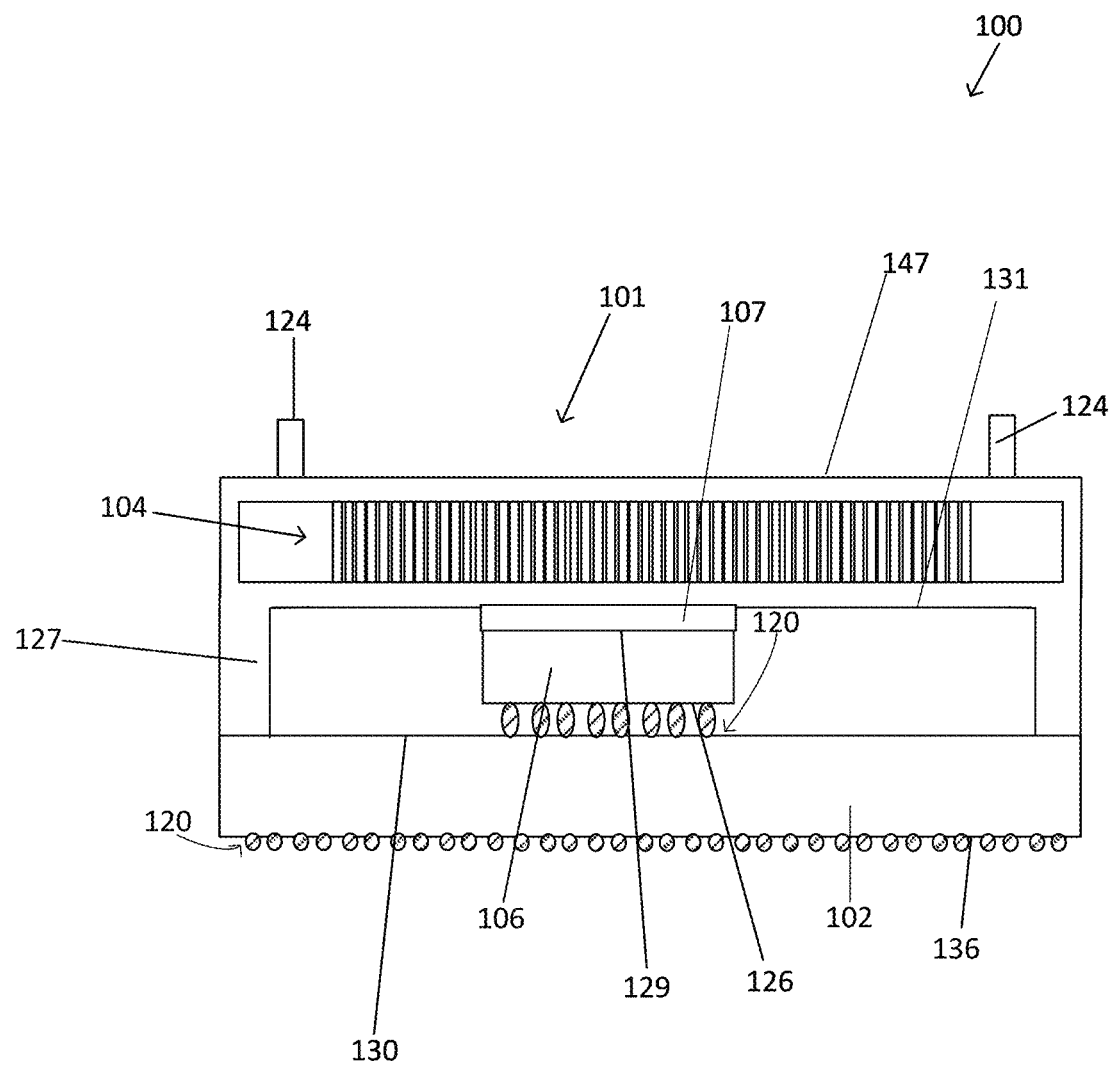
Figure 1I:
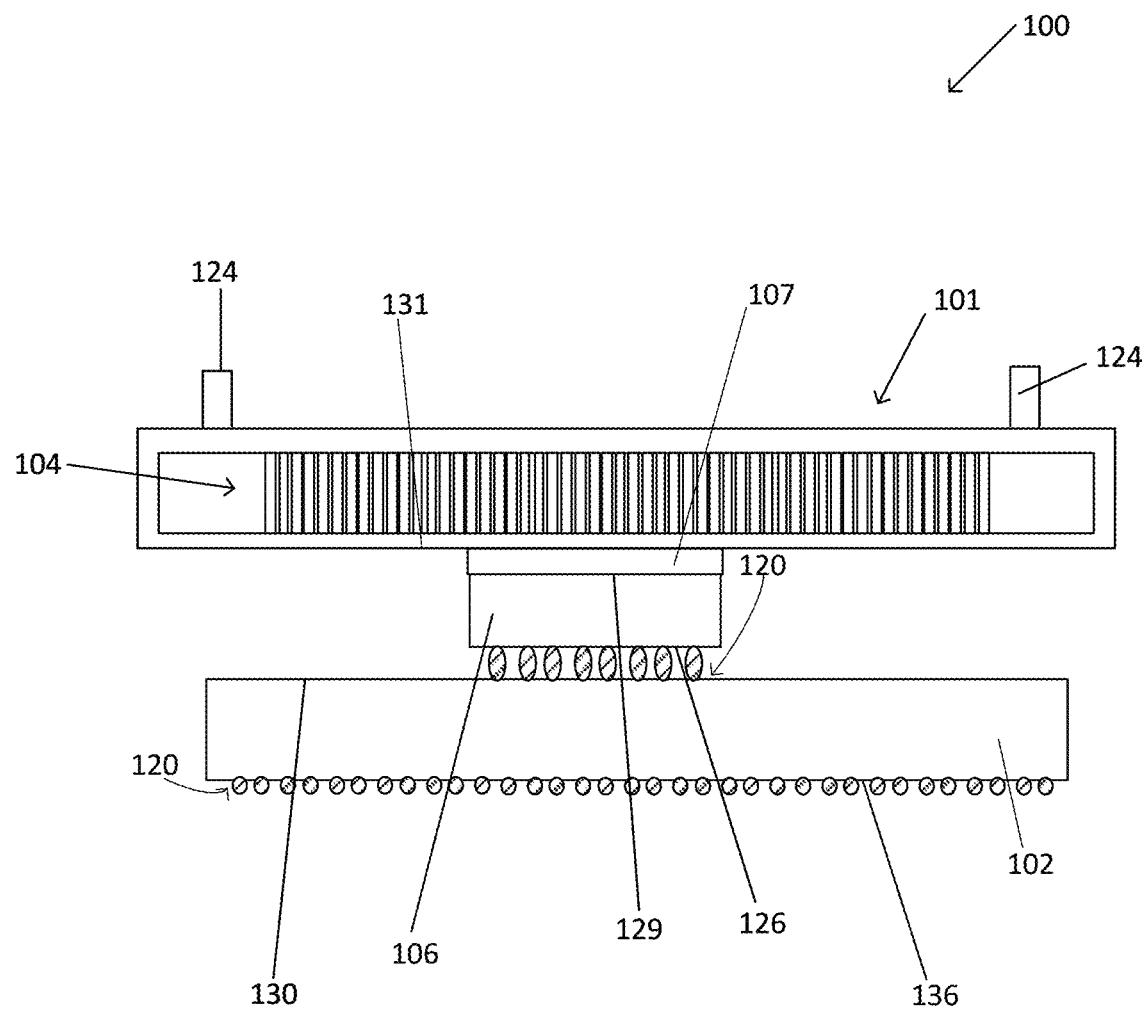

In another embodiment, a package structure 100 may comprise a cooling solution 101 wherein a heat spreader portion 127 is incorporated within the cooling solution 101 (FIG. 1H). The cooling solution 101 comprises two or more microchannel fin array structures 104, as in FIG. 1A for example. A single TIM 107 is utilized within the package structure 100, wherein the TIM 107 is between a first side 131 of the heat spreader portion 127 of the cooling solution 101 and a second side 129 of a device 106. A first side 126 of the device 106 is on a first side 130 of the substrate 102, wherein conductive interconnect structures 120 electrically couple the device 106 to the first side 130 of the substrate 102. A second side 136 of the substrate 102 may comprise conductive interconnect structures 120. The second side 136 of the substrate 102 may be coupled to a board, such as a motherboard for example (not shown). Inlet/outlet ports 124 are on a second side 147 of the cooling solution 101, in an embodiment, and are offset from the at least one microchannel fin array 104.

In another embodiment, a package structure 100 may comprise a cooling solution 101, wherein the cooling solution comprising two or more microchannel fin array structures 104, and wherein a first side 131 of the cooling solution 101 is directly on a TIM material 107 that is on a second side 129 of the device 106 (FIG. 14 A first side 126 of the device 106 is on a first side 130 of the substrate 102, wherein conductive interconnect structures 120 electrically couple the first side 126 of the device 106 to the first side 130 of the substrate 102. A single TIM 107 is utilized with the package structure 100, wherein the TIM 107 is between the first side 131 of the cooling solution 101 and the second side 129 of the device 106. A second side 136 of the substrate 102 may comprise conductive interconnect structures 120. The second side 136 of the substrate 102 may be coupled to a board, such as a motherboard for example (not shown).

Figure 2:
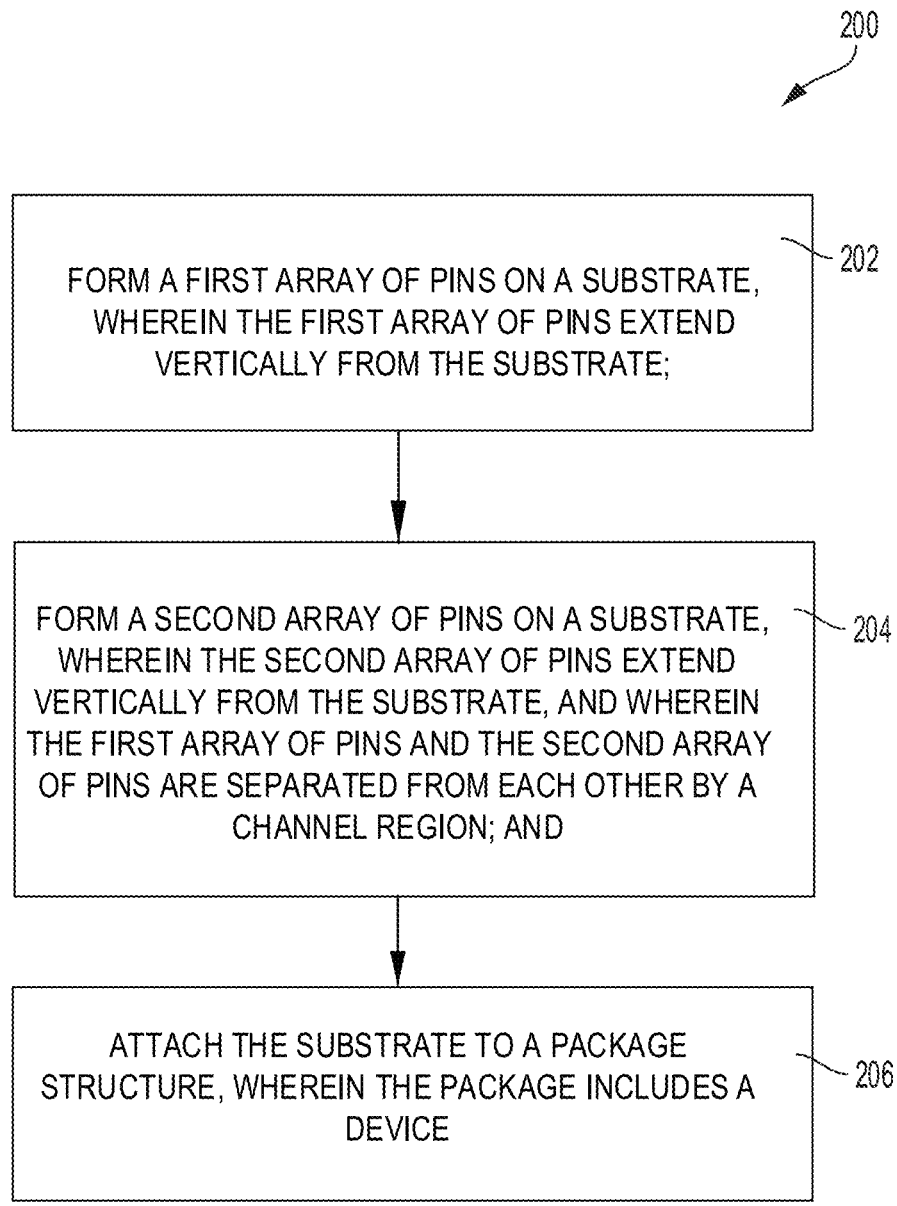
FIG. 2 is a flow diagram illustrating a method of fabricating package structures having blockage resistant microchannel fin array structures, according to embodiments.

FIG. 2 depicts a flow chart of an embodiment of a method 200 of forming a cooling solution structure having alternate routes for fluid flow through microchannels of at least two microchannel fin arrays. The cooling solution structures described herein enable a more reliable and efficient method of cooling an underlying device by avoiding microchannel blockage by particles or manufacturing defects, for example. The method 200 may share any or all characteristics with any other methods discussed herein, such as, not limited to, the methods disclosed in FIGS. 3A-3D, 4A-4C, and 5A-5B, for example, which may show cross-sectional views of structures employing any of the operations described in method 200. It should be noted that the order of the operations of method 200 may be varied, according to a particular application.

At operation 202, a first array of fins may be formed on a substrate, wherein the first array of fins extend vertically from the substrate. In an embodiment, the first array of fins may comprise a first length, and a first microchannel width, and may comprise any suitable thermal conductive material. In an embodiment the first array of fins may be formed by utilizing such processes as micro machining a solid piece of the thermally conductive material that may be attached onto a thermally conductive substrate. The thermally conductive material may comprise a fin block, in an embodiment. Microchannels may be micro-machined from a solid piece of thermal conductive material, to form an array of fins each separated from each other by a microchannel, wherein each individual microchannel may comprise a width of below about 50 microns, in some embodiments, and may comprise a microchannel width of below 100 microns in other embodiments. The width of the microchannels will depend on the particular application for which the cooling solution may be applied. The micro machining may be performed slicing a row of vertical channels across the thermally conductive material that is on the substrate, in a lengthwise direction, whereby vertical grooves are cut into the thermally conductive material. The micromachining tool may then be employed to slice one or more horizontal rows of grooves with the fin block. In an embodiment, the vertical fins formed by slicing the horizontal row or rows comprise a smaller length dimension than the vertical fins adjacent to the horizontal row or rows. The smaller vertical row formed near the edge of the longer vertical fins, (and closest to an inlet/outlet port of the cooling solution) may comprise the first array of vertical fins, in an embodiment.

In another embodiment, a micro skiving process may be employed with which to form the first array of fins. A thermally conductive fin block may be formed/attached to the base plate. A micro-skiving process may be utilized, which may employ a plurality of rotating blades. One or more horizontal channels may be micro skived across the fin block. Then, the rotating blades of the micro skiving process may form a plurality of vertical microchannel grooves within the fin block, to form at least two fin arrays within the fin block, which are separated by a horizontal channel region. The first array of fins may comprise those fins closest to an inlet/outlet port of the cooling solution. The number of horizontal channel regions that may be formed may depend on the particular application, however at least one horizontal channel region may be formed. In another embodiment, the first fin array may be formed by employing an additive formation process, such as a 3D printing process, or an electroplating process, for example. In an embodiment, the first array of fins may comprise a height of between about 100 microns to about 4 millimeters, and a length that is smaller in magnitude than than a second, adjacent array of fins that may be formed on the substrate. At least one horizontal channel region separates the fin array segments from each other. In an embodiment, the second fin array comprises a length which is greater than about five hundred times the length of the first fin array.

In an embodiment, each individual fin may comprise a width of between about 100 microns to about 1 millimeter, but may comprise other widths according to the particular design requirements. In an embodiment, the fins may comprise any suitable material that is thermally conductive, such as silicon, copper, aluminum, and/or or ceramic materials, such as aluminum nitride, or silicon carbide, for example.

At operation 204, a second array of fins may be formed on the substrate, wherein the second array of fins extend vertically from the substrate and wherein the first array of fins and the second array of fins are separated from each other by a channel region. In an embodiment, the second array of fins may be formed by employing one or more of the micro-skiving, micro machining, or an additive process such as a 3D printing process or en electroplating process. The channel region, which may comprise a rectangular region between adjacent fin arrays, provides alternate channel routing for fluid to flow between an inlet and an outlet port for example. The inlet and the outlet ports may be formed in the base cover of the cooling solution, which can be assembled after the formation of the first and second micro fin arrays on the base, and may be placed onto the base. The channel region between the fin arrays provides for the alternate routing of the fluid around any blockage that may occur within any individual microchannel.

At operation 206, the cooling solution may be attached to a package structure, wherein the package structure includes a device. The cooling solution is thermally coupled to the device. The cooling solution provides an enhanced thermal cooling capability and alternate cooling routes for the thermally coupled die.

FIGS. 3A-3D depict cross-sectional and top views of structures formed by employing processes of fabricating cooling solution structures comprising alternative fluid routing pathways that may be thermally coupled with a device, in order to more efficiently cool the device. The cooling solution structures described in the embodiments herein provide for alternative routing of fluid within microchannel fin arrays, in the event of particulate blockage and/or manufacturing anomalies within the microchannel fin arrays, especially when a microchannel width of individual microchannels within microchannel fin arrays is below about 100 microns, for example.

In FIG. 3A (depicting cross-sectional and top views), a base substrate 103 may have a thermally conductive fin block 108 on a surface. The thermally conductive fin block 108 may comprise any suitable thermally conductive material, and may or may not be the same thermally conductive material as the base structure 103. The fin block 108 is positioned centrally on the base structure 103. Inlet and outlet ports (not shown) may be fabricated on a cover plate (such as the cover plate 143 of FIG. 1D, for example), and the cover may be placed placed on the substrate 103, wherein the inlet/outlet ports may be at either side of the fin block 108. The inlet/outlet ports provide for a fluid to enter and exit microchannels which are to be formed within the fin block 108. In an embodiment, the thermally conductive fin block 108 and/or base 103 may comprise any suitable thermally conductive material, such as copper or copper alloy materials or silicon or aluminum or ceramics materials, such as aluminum nitride, or silicon carbide, for example.

Figure 3C:
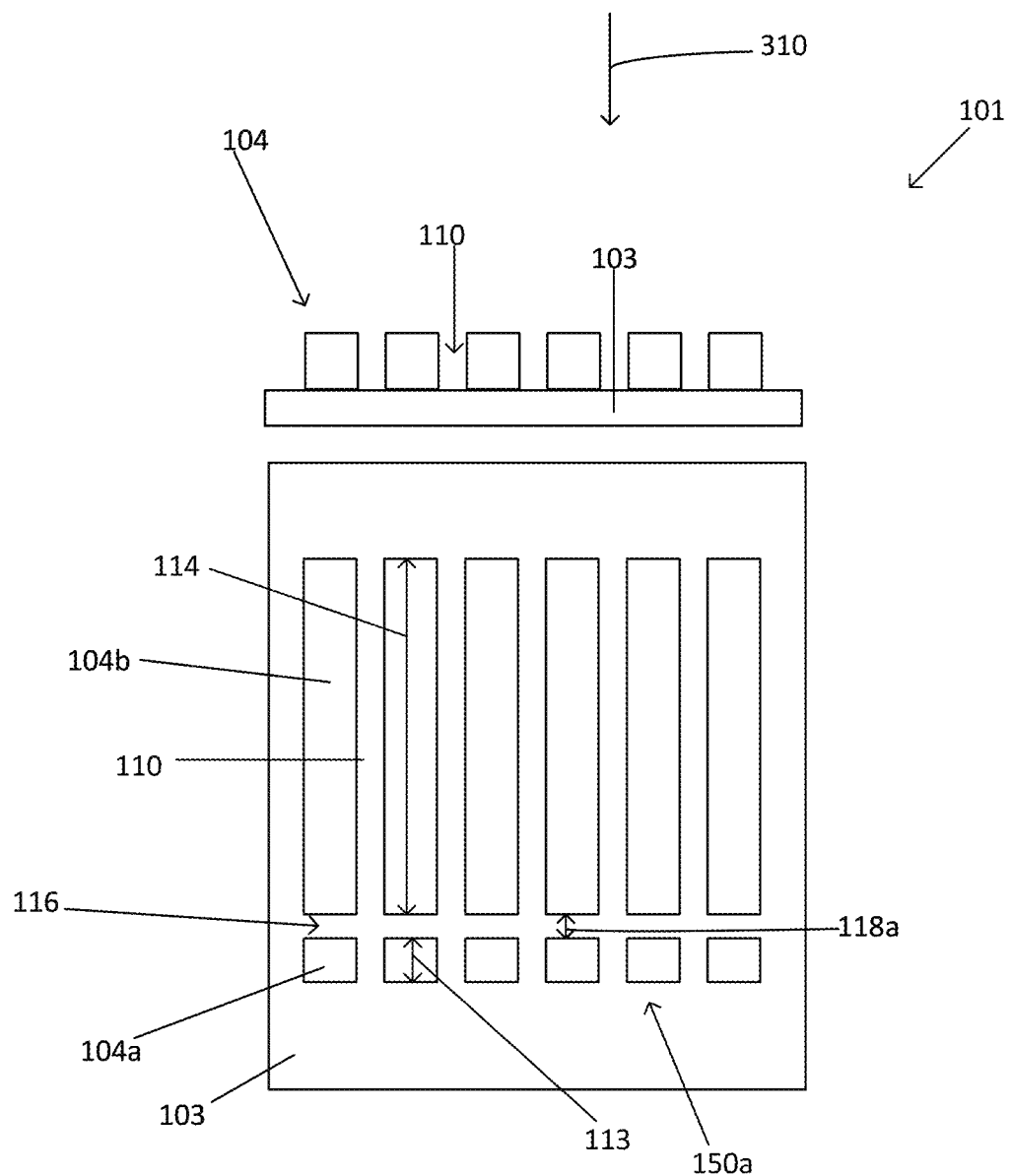

In an embodiment, a process 310, such as a micromachining process, for example, may be employed wherein longitudinal microchannels 110 may be formed within the fin block 108, which are between adjacent fin structures 104, such as between fin structure 104', 104", for example (FIG. 3B). A channel width 119 between adjacent fin structures 104', 104" may comprise below about 100 microns, and in other cases may comprise a magnitude below about 1 millimeter. In FIG. 3C, a first horizontal channel region 116 may be formed near a first edge 150a of the first microchannel fin array structures 104a. The first horizontal channel 116 may be formed by any suitable micro machining process, such as micro machining process 310. By utilizing the micromachining process 310 for both the longitudinal and horizontal microchannel formation processes, throughput time for the manufacturing of the cooling solution is reduced, and ease of manufacturing is facilitated. The first channel region 116 may comprise a width 118, between the first microchannel fin array segment 104a and a second microchannel fin array segment 104b. Individual fins of the second microchannel fin array 104b may comprise a length 114 that may be greater than a length 113 of individual fins of the second microchannel fin array 104b.

Figure 3D:
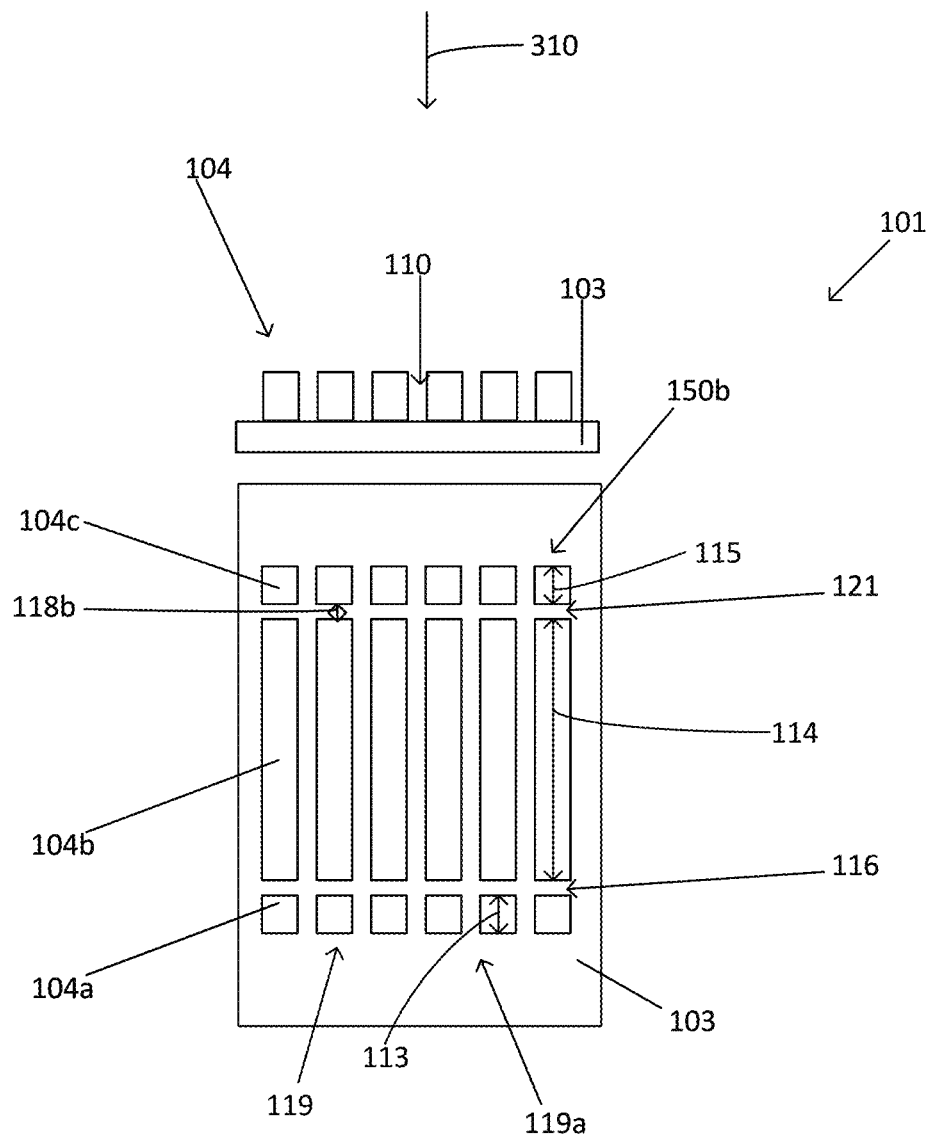

In FIG. 3D, a second horizontal channel region 121 may optionally be formed near an edge 150b, opposite the first edge 150a, of the second microchannel fin array 104b to form a third microchannel array 104c of the cooling solution 101. The second horizontal channel region 121 may be formed by a micro machining process 310, in an embodiment. The second horizontal channel region 121 may comprise a width 118b, between the second microchannel fin array 104b and the third microchannel fin array 104c. Individual fins of the third microchannel fin array 104c may comprise a length 115 that may be less than the length 114 of individual fins of the second microchannel fin array 104b.

Figure 4A:
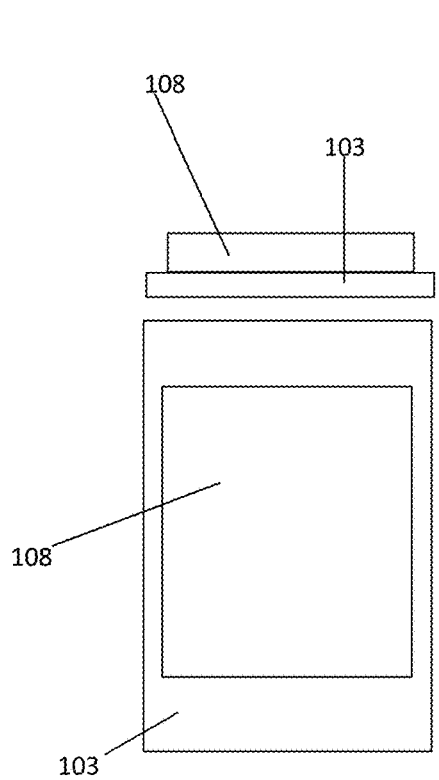
FIGS. 4A-4C illustrate top views of package structures formed according to methods of fabricating blockage resistant microchannel fin array structures, according to embodiments.
Figure 4B:
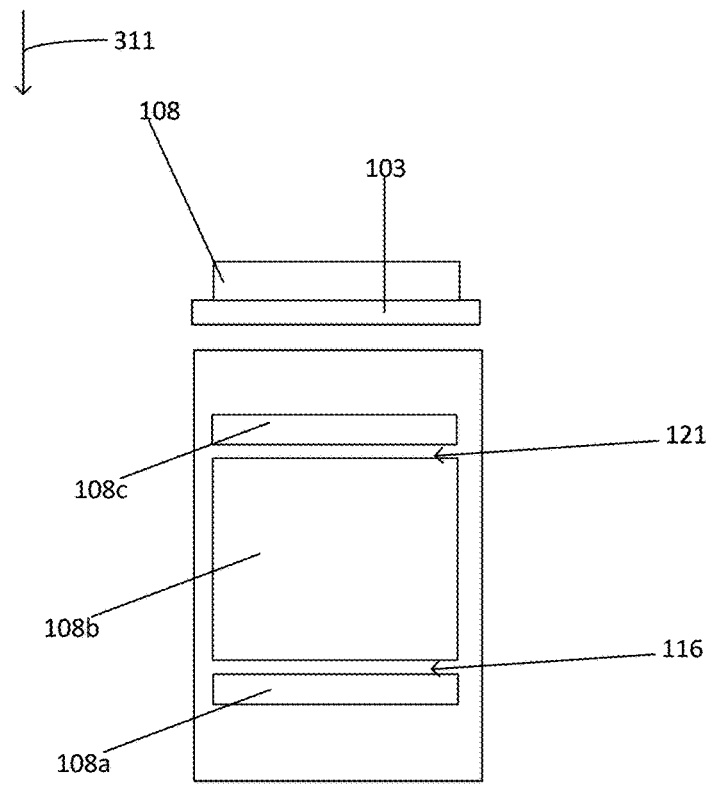
Figure 4C:
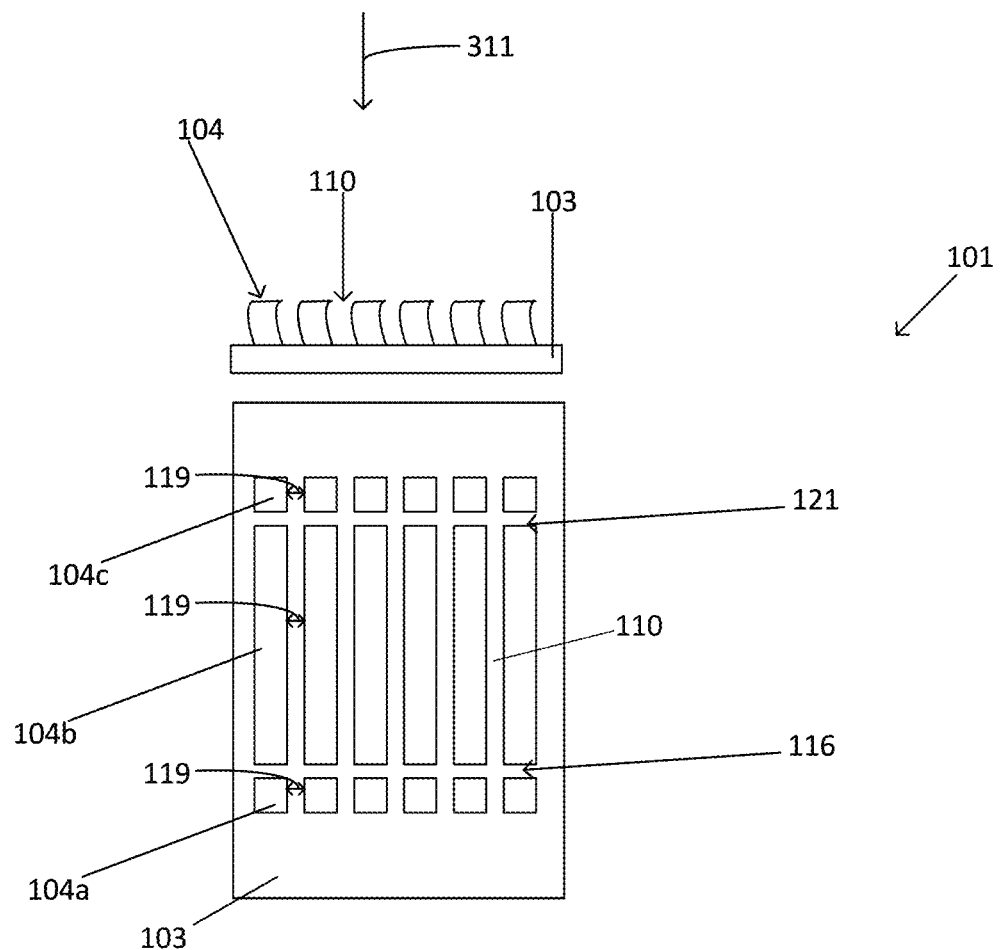

In FIG. 4A, a base structure 103 may have a thermally conductive fin block 108 disposed on a surface. The thermally conductive in block 108 may comprise any suitable thermally conductive material, and may or may not be the same thermally conductive material as the base structure 103. The fin block 108 is positioned centrally on the base structure 103. In an embodiment, a micro skiving process 311 may be employed, wherein horizontal channel regions 116, 121 may be formed within the fin block 108. The horizontal channel regions 116, 121 may be created between adjacent fin block portions 108a, 108b, and between fin block portions 108b, 108c, for example (FIG. 4B). In FIG. 4C, the micro skiving process 311 may be employed to form any number of longitudinal microchannels 110 within the fin block 108 to form the cooling solution 101, and wherein adjacent microchannel fin array segments 104a, 104b, 104c are formed, for example. Utilizing the microskiving process 311 for both longitudinal and horizontal channel formation enables ease of formation of the cooling solution 101. A microchannel width 119 between adjacent fins of the micro channel fin arrays 104a, 104b, 104c may comprise below about 1000 microns in an embodiment, and in other embodiments may comprise a magnitude below about 100 microns.

Figure 5A:
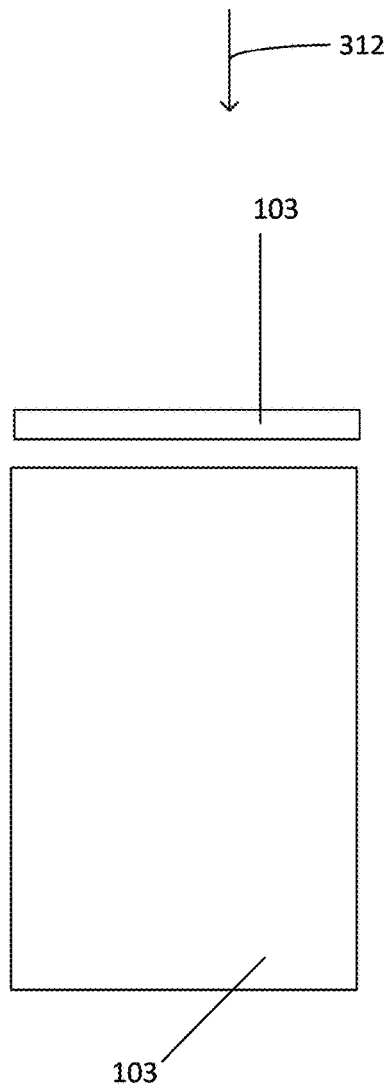
FIGS. 5A-5B illustrate top views of package structures formed according to methods of fabricating blockage resistant microchannel fin array structures, according to embodiments.

In FIG. 5A, a base substrate 103 may be provided. In an embodiment, the thermally conductive base substrate 103 may comprise any suitable thermally conductive material, such as copper or copper alloy materials or aluminum or silicon or cermics materials, such as aluminum nitride, or silicon carbide, for example.

Figure 5B:
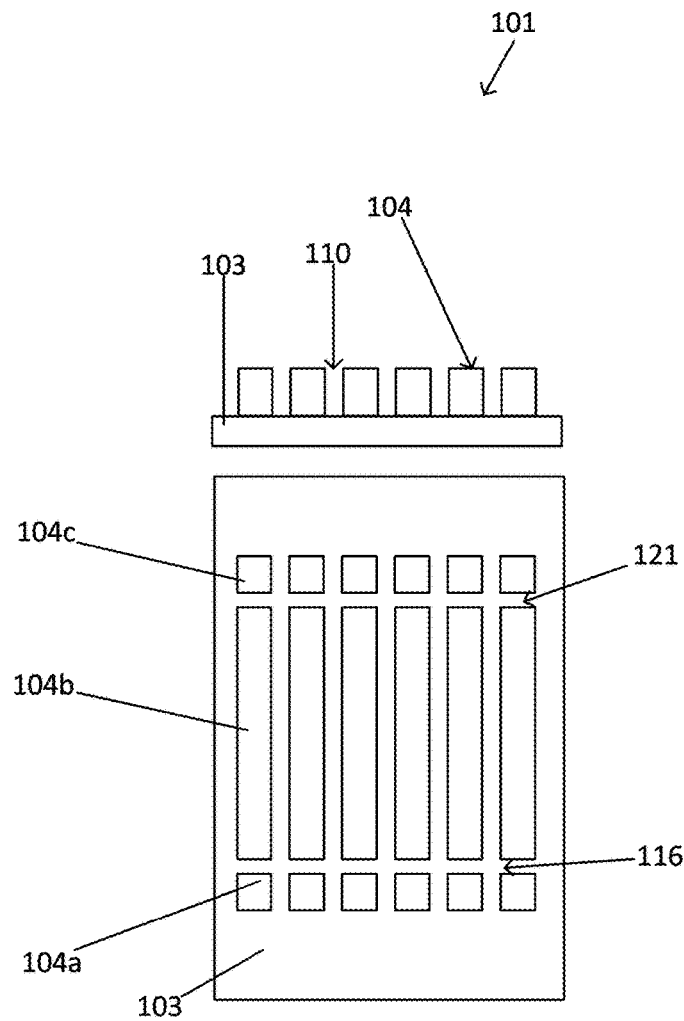

In an embodiment, an additive process 312, such as a 3D printing process and/or an electroplating process, for example, may be employed, wherein microchannel fin array structures 104a, 104b, 104c may be formed on the base structure 103 (FIG. 5B). Horizontal channel regions 116, 121 may be created between adjacent microchannel fin array structures 104a, 104b, 104c. A width 118 of horizontal channel regions 116, 121 may comprise between about 100 microns and about 1000 microns, in an embodiment. The additive process 312 may utilize any suitable thermally conductive materials, and may create any suitable dimensions for the microchannel fin arrays, channel regions, and/or microchannel widths. Inlet and outlet ports for fluid transport may be fabricated on/within a cover plate (such as the cover plate shown in FIG. 1D, for example) wherein inlet/outlet ports may be located/placed at opposite sides of the first and third microchannel fin arrays 104a, 104c. The inlet/outlet ports provide for a fluid to enter and exit microchannels of the cooling solution 101.

Figure 6A:
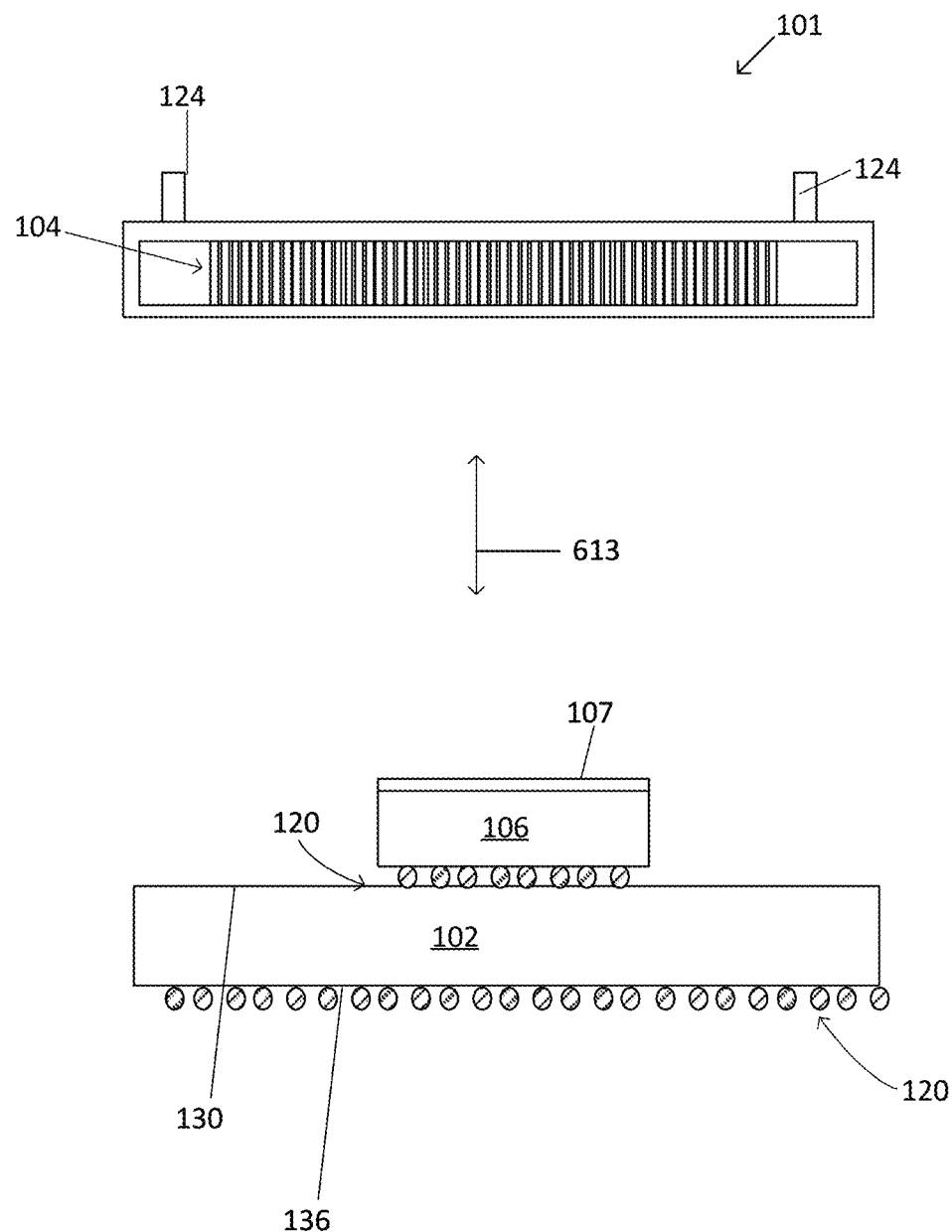
FIGS. 6A-6B illustrate cross-sectional views of an assembly method for coupling a cooling solution having blockage resistant microchannel fin array structures to a package structure, according to embodiments.

In FIG. 6A, an attachment process 613 is depicted, wherein a cooling solution 101, such as a cooling solution according to any of the embodiments of the cooling solutions 101 depicted herein, is attached to a device 106 on a first side 130 of a substrate 102. In an embodiment, the device 106 may comprise a plurality of interconnect structures 120, which may comprise solder balls, such as an array of ball grid array (BGA) solder balls, for example. In other embodiments, the interconnect structures 120 may comprise any geometry, such as pillars for example and may comprise any suitable conductive material, such as copper for example. The interconnect structures 120 may physically and electrically couple the device 106 to the substrate 102.

The second side 136 of the substrate 102 may comprise interconnect structures 120, such as solder balls, for example, which may be attached subsequently to a board, such as a motherboard (not shown).

A cooling solution 101 may comprise such thermally conductive materials as a copper for example. In an embodiment, the cooling solution 101 may comprise any number of particle filtering microfin arrays, such as those depicted in FIG. 1A, for example. A thermal interface material (TIM) 107 may be disposed on a surface of the device 106. In an embodiment the TIM 107 may comprise a conductive TIM, such as a solder material for example. In other embodiments, the TIM 107 may comprise any other suitable TIM 107 material. In another embodiment, the TIM 107 may comprise an electrically insulating material, such as a thermal grease and/or a metal particle infused polymer.

Figure 6B:
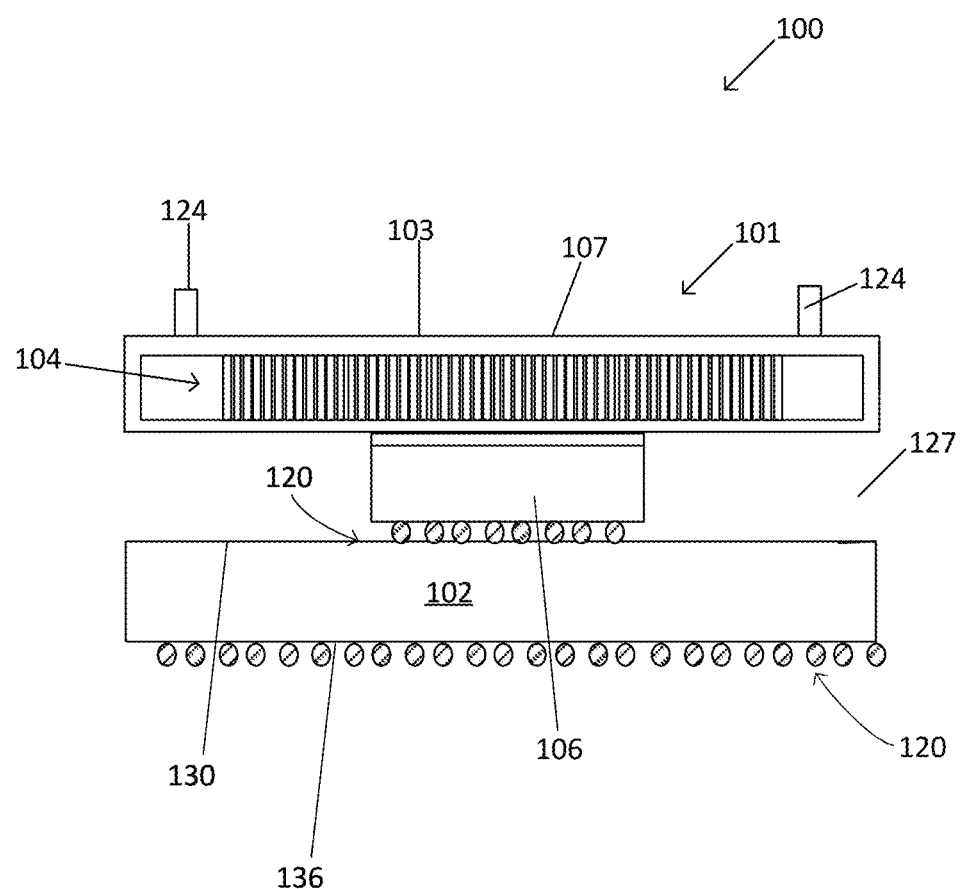

FIG. 6B depicts the package structure 100 comprising the cooling solution 101 attached to the TIM 107 of the device 106. The substrate 102 may comprise various types of materials, such as conductive, dielectric and/or semiconductor materials. The device 106 may include any number of circuit elements, such as any type of transistor elements and/or passive elements. The device 106 may comprise N-type and/or P-type transistors, which may include materials such as silicon, germanium, indium, antimonide, lead telluride, indium arsenide, indium phosphide, gallium arsenide, or gallium antimonide, for example. The device 106 may include such structures as planar transistors and/or nonplanar transistors, FinFET transistors, nanowire transistors and/or nanoribbon transistors.

The die 104 may be attached to the substrate 102 by using any suitable attachment process 172, where the plurality of interconnect features 120 on the second side 109 of the die 104 may be joined to interconnect features/pads (not shown) that are on the surface of the substrate 102. Active surfaces of the die 104 may be attached to the substrate 102, wherein conductive contacts of various integrated circuit devices, such as transistor devices, for example, may be available for connection to the package substrate 102.

The interconnect structures 120 may be formed by using solder materials, such as tin, indium, silver, gold, nickel, for example in an embodiment. Other conductive materials may be used to form the interconnect structures. The interconnect structures 120 may comprise any shape, such as a spherical shape or a rectangular shape, for example. The interconnect structures 120 may be formed using metallization processing such as physical vapor deposition or plating processing. In an embodiment, the substrate 102 may be subsequently attached to a board, such as a motherboard, for example.

Figure 7:
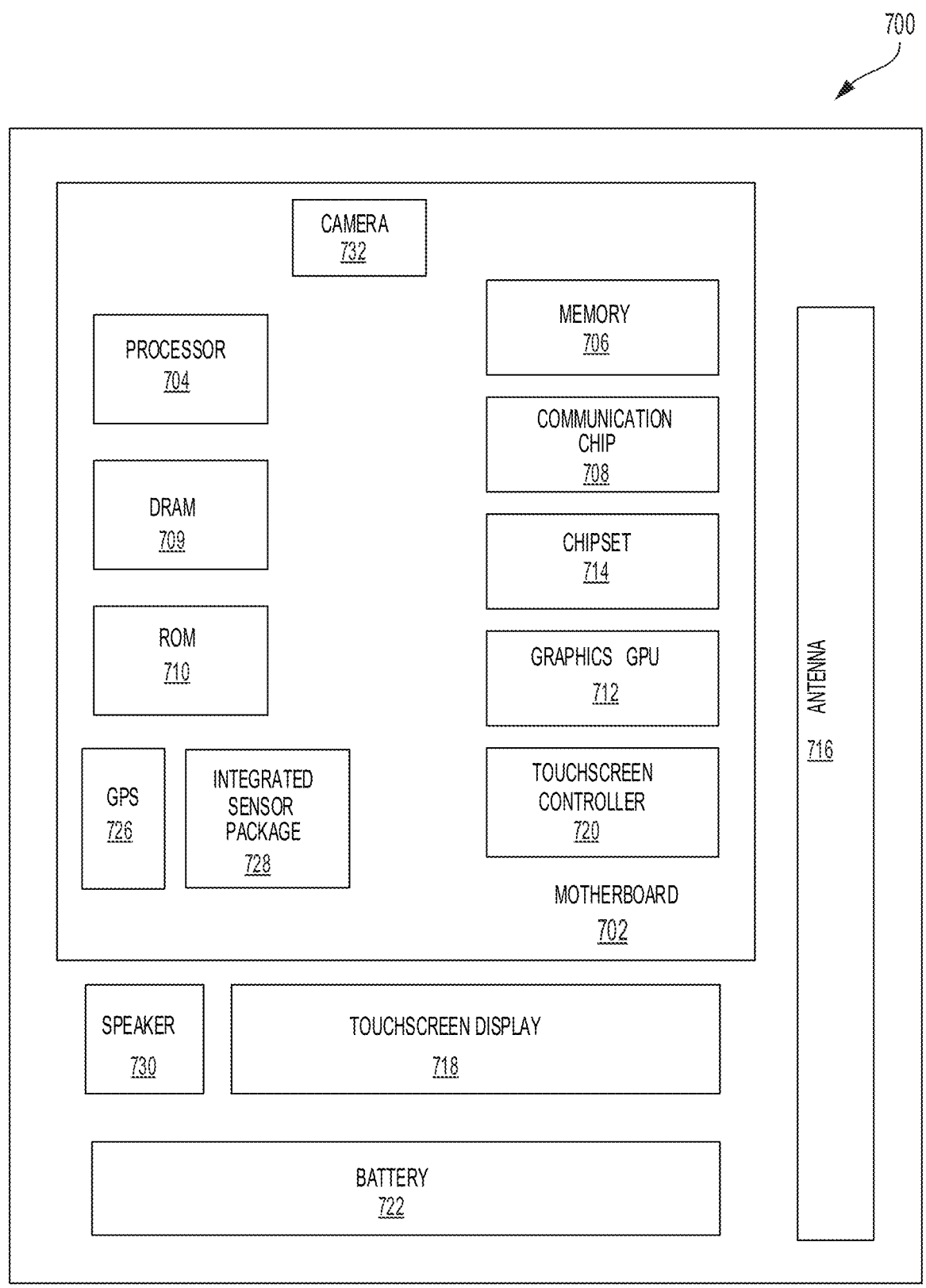
FIG. 7 is a functional block diagram of a computing device employing a cooling solution having blockage resistant microchannel fin array structures, according to embodiments.

FIG. 7 is a schematic of a computing device 700 that may be implemented incorporating the package structures described in any of the embodiments herein comprising a thermally coupled cooling solution having microchannel fin array structures. The microchannel fin array structures of the cooling solution includes alternate fluid routing pathways that provide improved cooling for a device that may be thermally coupled to the cooling solution, such as the cooling solution depicted in FIG. 1A, for example. In an embodiment, the computing device 700 houses a board 702, such as a motherboard 702 for example. The board 702 may include a number of components, including but not limited to a processor 704, an on-die memory 706, and at least one communication chip 708. The processor 704 may be physically and electrically coupled to the board 702. In some implementations the at least one communication chip 708 may be physically and electrically coupled to the board 702. In further implementations, the communication chip 708 is part of the processor 704.

Depending on its applications, computing device 700 may include other components that may or may not be physically and electrically coupled to the board 702, and may or may not be communicatively coupled to each other. These other components include, but are not limited to, volatile memory (e.g., DRAM) 709, non-volatile memory (e.g., ROM) 710, flash memory (not shown), a graphics processor unit (GPU) 712, a chipset 714, an antenna 716, a display 718 such as a touchscreen display, a touchscreen controller 720, a battery 722, an audio codec (not shown), a video codec (not shown), a global positioning system (GPS) device 726, an integrated sensor 728, a speaker 730, a camera 732, an amplifier (not shown), compact disk (CD) (not shown), digital versatile disk (DVD) (not shown), and so forth). These components may be connected to the system board 702, mounted to the system board, or combined with any of the other components.

The communication chip 708 enables wireless and/or wired communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 700 may include a plurality of communication chips 708. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 700 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

What is claimed is:

1. A microelectronic cooling solution comprising:
    a substrate;
    a first array of fins, wherein the first array of fins extends vertically from the substrate, and wherein adjacent individual fins of the first array are separated from each other by a microchannel; and
    a second array of fins extending vertically from the substrate, wherein a channel region is between the first array of fins and the second array of fins, wherein a length of individual fins of the second array of fins is greater than twice a length of individual fins of the first array of fins.

2. The microelectronic cooling solution of claim 1, further comprising a third array of fins extending from the substrate adjacent the second array of fins, wherein the channel region comprises a first channel region, and wherein the second array of fins and the third array of fins are separated from each other by a second channel region.

3. The microelectronic cooling solution of claim 1, wherein a width of the microchannel is below about 100 microns, and wherein a length of individual fins of the second array of fins is greater than about twice a length of individual fins of the first array of fins.

4. The microelectronic cooling solution of claim 3, wherein the cooling solution further comprises a cover, wherein the cover is on a top portion of the cooling solution, wherein an inlet port is on the cover, and is adjacent to the first array of fins, and wherein an outlet port is adjacent to the second array of fins.

5. The microelectronic cooling solution of claim 1, wherein a width of the channel region is substantially equal to a width of the microchannel.

6. The microelectronic cooling solution of claim 1, wherein the microchannel comprises a first microchannel, and wherein individual fins of the second array are separated from each other by a second microchannel, and wherein a width of the second microchannel is substantially equal to a width of the channel region.

7. The microelectronic cooling solution of claim 1, wherein the cooling solution includes a portion of an integrated heat spreader.

8. The microelectronic cooling solution of claim 1, wherein a package structure is thermally coupled to a surface of the cooling solution.

9. The microelectronic cooling solution of claim 8, wherein a device is on a substrate of the package structure, wherein the device is thermally coupled to the cooling solution.

10. An assembly comprising:
    a substrate:
    a die comprising an integrated circuit, wherein the die is on the substrate; and
    a cooling solution thermally coupled to the die, the cooling solution comprising:
        a base;
        a first array of fins, wherein the first array of fins extends vertically from the base, and wherein individual fins of the first array of fins are separated from each other by a microchannel; and
        a second array of fins extending vertically from the base,
    wherein a channel region is between the first array of fins and the second array of fins, and wherein a length of individual fins of the second array of fins is greater than twice a length of individual fins of the first array of fins.

11. The assembly of claim 10, wherein the channel region comprises a rectangular area between the first array of fins and the second array of fins, wherein the channel region is free of fins.

12. The assembly of claim 10, further comprising a third array of fins extending vertically from the base and adjacent the second array of fins, wherein individual fins of the third array of fins are separated from each other by a width of the microchannel, and wherein the channel region comprises a first channel region, and wherein a second channel region is between the second array of fins and the third array of fins.

13. The assembly of claim 10, wherein a thermal interface material (TIM) is directly on a surface of the die, and wherein the TIM is between the cooling solution and the die.

14. The assembly of claim 10, wherein the cooling solution comprises a portion of an integrated heat spreader, wherein a TIM is on a first side of the integrated heat spreader, and wherein a portion of the integrated heat spreader is on the substrate.

15. The assembly of claim 10, wherein an integrated heat spreader is between the die and the cooling solution, wherein a first TIM is between the integrated heat spreader and the die, and a second TIM is between the integrated heat spreader and the cooling solution.

16. The assembly of claim 10, wherein a length of the second array of fins is more than about twice a length of the first array of fins.

* * * * *